United States Patent [19]

Arthur

[11] Patent Number: 5,574,359
[45] Date of Patent: Nov. 12, 1996

[54] REMOVABLE TESTER CONTACT

[75] Inventor: Jim L. Arthur, Hamilton, Ill.

[73] Assignee: Methode Electronics, Inc., Chicago, Ill.

[21] Appl. No.: 357,407

[22] Filed: Dec. 16, 1994

[51] Int. Cl.⁶ .................. G01R 31/02; H01R 13/00
[52] U.S. Cl. .............. 324/72.5; 324/754; 439/188; 439/851
[58] Field of Search ................... 324/72.5, 73.1, 324/715, 724, 754; 439/188, 482, 851

[56] References Cited

U.S. PATENT DOCUMENTS

| | | | |
|---|---|---|---|
| 3,450,849 | 6/1969 | Klaiber et al. | 439/188 X |
| 3,903,385 | 9/1975 | Moyer et al. | 439/188 X |
| 4,087,151 | 5/1978 | Robert et al. | 439/188 |
| 4,106,841 | 8/1978 | Vladic | 439/188 |
| 4,358,135 | 11/1982 | Tsuge et al. | 439/188 X |
| 4,804,339 | 2/1989 | Cohen | 439/188 X |
| 5,378,164 | 1/1995 | Vidacovich et al. | 439/188 |

OTHER PUBLICATIONS

Pylon Company, Inc., Pogo Contacts and Other Contact Products, 1987, pp. 4, 14, (month unavailable).

*Primary Examiner*—Maura K. Regan
*Assistant Examiner*—Diep Do
*Attorney, Agent, or Firm*—David L. Newman

[57] ABSTRACT

A tester contact for providing a reliable test interface between electrical test equipment and a test item. The tester contact consists of two contact beams partially mounted within a contact body. Each of the contact beams has a first end, a second end, and is constructed of a resilient metal material.

16 Claims, 5 Drawing Sheets

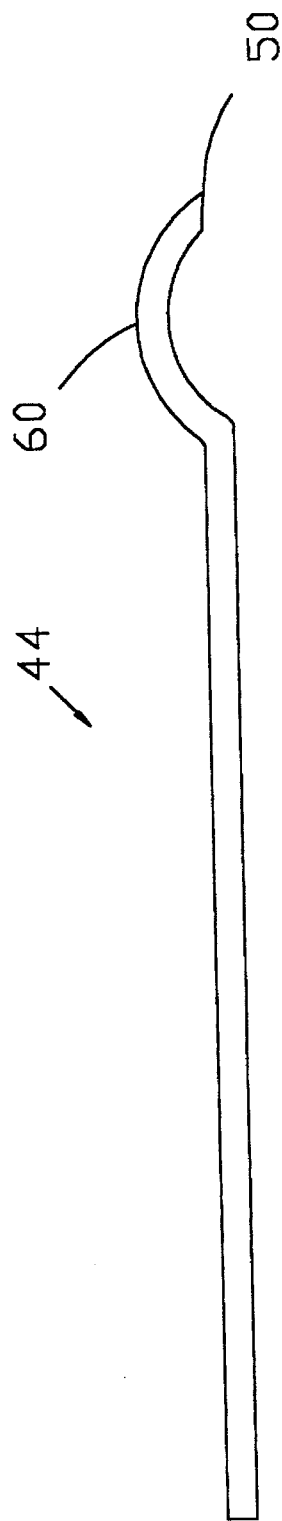
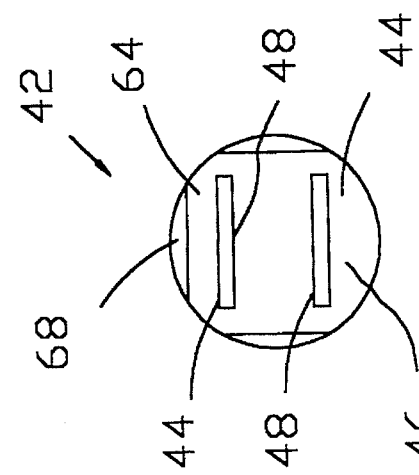
Fig. 6
Fig. 7

REMOVABLE TESTER CONTACT

BACKGROUND OF THE INVENTION

This invention pertains to a tester contact for testing electrical contacts, and in particular to a tester contact which reliably provides for efficient current sourcing and voltage sensing.

Currently, test equipment for multi-function switches and ignition switches are provided with a connector having Pogo® contacts (PYLON Company, Inc., Attleboro Fails, Mass.) or custom built test contacts. Referring to FIG. 1, a Pogo® contact 10 generally consists of a conductive tubular housing 12 with a single cylindrical electrical contact 14 which is slidably mounted within the housing. Furthermore, the first end 16 of the electrical contact 14 extends from the tubular housing 12 and the second end 18 of the electrical contact is acted upon by a spring 20 and bail 22 assembly mounted within the tubular housing.

Electrical testing is performed by pressing the first end 16 of the electrical contact 14 against an electrical test point on the switch to be tested (test point and switch not depicted in FIG. 1). However, the amount of actual pressure applied by the Pogo® contact 10 is determined by how much force the spring 20 and bail 22 assembly exerts in pushing the first end 16 of the electrical contact 14 against the test point of the switch. Furthermore, the pushing of the electrical contact 14 against the test point results in the need to firmly hold the switch in place so that it will not move away from the Pogo® contact 10.

Problems also occur with the utilization of the Pogo® contact 10 whenever foreign material is present between the first end 16 of the electrical contact 14 and the test point, or if any foreign material is present within the Pogo® contact itself. Any foreign material which is not removed before testing may prevent or result in inaccurate test results.

Likewise, the single electrical test contact 14 provided by the Pogo® contact 10 will prevent separate current sourcing and voltage sensing of the test point. Therefore, the use of a single electrical contact 14 will result in a greater voltage sense error as the level of current being sourced is increased.

Turning to FIG. 2, a custom built test contact assembly 24 is depicted. The custom contact assembly 24 generally consists of two conductive beams 26,26, made of a conductive metallic material, which are surrounded by two rubber bands 28,28 located adjacent to the ends of the beams. In addition, an insulator plate 30 is sandwiched between the conductive beams 26,26 and thus allows for separate current sourcing and voltage sensing by the beams.

Each beam 26 of the custom contact assembly 24 has a first end 32 and a second end 34. As shown by the top view of the custom contact assembly depicted in FIG. 3, the cross section of each beam 26 has a flat side 36 and a rounded side 38 which results in the beam being generally D-shape in cross section. The flat side 36 of each beam 26 adjoins the insulator plate 30 so that the insulator plate is sandwiched between both of the beams. However, referring back to FIG. 2, the insulator plate 30 does not extend the full length of the beams 26,26 which results in a slot 40 being provided between the beams on the first end 32. In addition, the first end 32 of each beam 26 is tapered 41 between the flat portion 36 and the first end 32 in order to facilitate the insertion of the object under test between the beams.

Turning back to FIG. 3, as stated previously, two rubber bands 28 extend around the rounded side 38 of each beam 26,26 (only one band is shown). The bands are located on each end of the beams and the insulator plate 30. The bands provide a constant force to hold the insulator plate 30 between the beams 26,26.

When a test item is to be place in the slot 40 between the beams 26,26 in FIG. 2, the beams will separate. The separation of the beams is made possible by the resiliency of the bands 28,28 and the limited flexibility of the beams 26,26. However, the design of the test contact assembly 24 has several significant limitations. First, the custom contact assembly 24 is very time consuming to build and repair. Second, after repeated expansion and contraction during the insertion and removal of test items between the contact beams 26,26, the bands 28,28 will become fatigued and thus will need to be replaced. Third, when an item is inserted in the slot 40 between the beams 26,26, the electrical contact area is limited to the narrow area on the test item being pinched by the two beams. The last limitation cannot be overcome by simply making each of the beams flat because they would quickly cut into the bands with their sharp edges.

In view of the above, it is an object of the present invention to provide for separate current sourcing and voltage sensing.

A further object of the invention is to provide a contact which wipes foreign matter away from the test point.

Also an object of the invention is to provide a reliable electrical connection between the tester contact and the item under test.

An additional object of the invention is to provide a contact which holds the test item.

Another object of the invention is to provide a contact which is easily maintained.

It is also an object of the invention to provide a contact which is easy to manufacture.

An additional object of the invention is to provide a reliable contact.

SUMMARY OF THE INVENTION

In one form of the invention, a tester contact provides a reliable test interface between an electrical test equipment connector and a test item having a test point. The tester contact has a rigid contact holder and provides for separate current sourcing and voltage sensing of the electrical test point. In one embodiment, the tester contact provides for separate current sourcing and voltage sensing by employing two contact beams mounted to the contact body. The two beams are secured to the contact holder by means such as a first mounting hole positioned thorough the contact beams and/or a dimple.

The tester contact also provides for the wiping away of foreign material which may be present on the electrical test point. One method for removing the foreign material consists of having a curvature located on at least one of the contact beams.

Furthermore, the tester contact provides for holding the test item. In one embodiment, the tester contact holds the test item with the two contact beams which are mounted to the contact body.

In another embodiment, the tester contact also facilities the making of an electrical connection between it and the test item. To facilitate the making of an electrical connection, the tester contact has a curvature located adjacent to one end of at least one of the contact beams.

In yet another embodiment, the tester contact also provides for ensuring proper orientation during its installation within the test equipments connector. The contact holder of the tester contact may have a top wall and two side walls located on its exterior or just a top wall, in order to provide for proper orientation.

Various means for practicing the invention and other advantages and novel features thereof will be apparent from the following description of an illustrative preferred embodiment of the invention.

BRIEF DESCRIPTION OF THE DRAWINGS

There is shown in the drawings a presently preferred embodiment of the present invention, wherein like numerals in the various figures pertain to like elements, and wherein:

FIG. 6 is a side view of the contact beam shown in FIG. 5;

FIG. 7 is an end view of the tester contact shown in FIG. 4;

DETAILED DESCRIPTION OF THE PRESENTLY PREFERRED EMBODIMENTS

Figure 1:
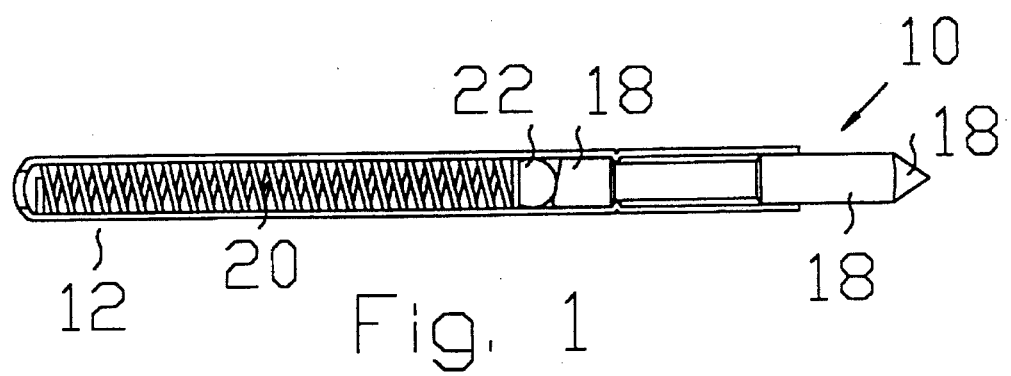
FIG. 1 is an enlarged cross-sectional fragmentary view of a prior art contact.
Figure 2:
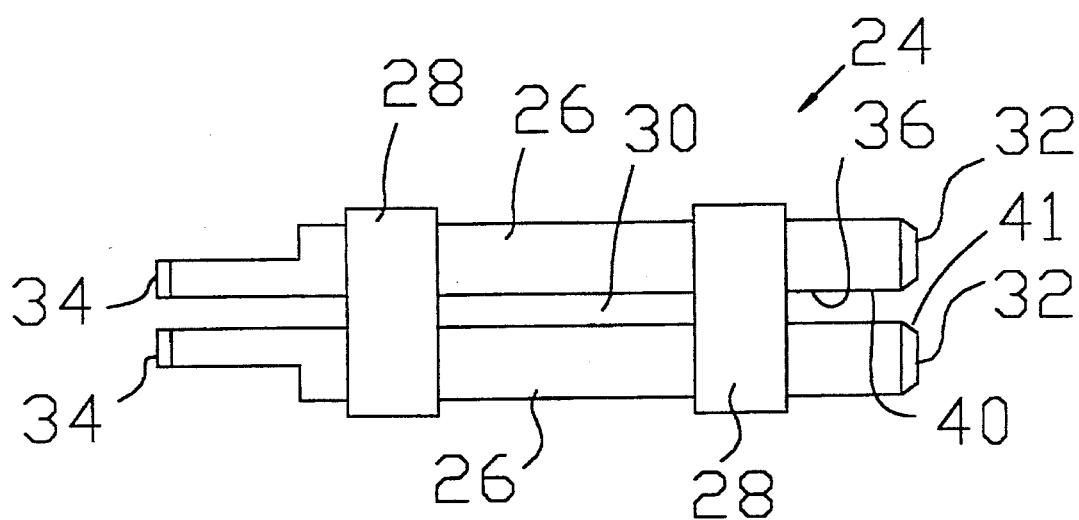
FIG. 2 is an enlarged side view of a prior art custom contact assembly.
Figure 3:
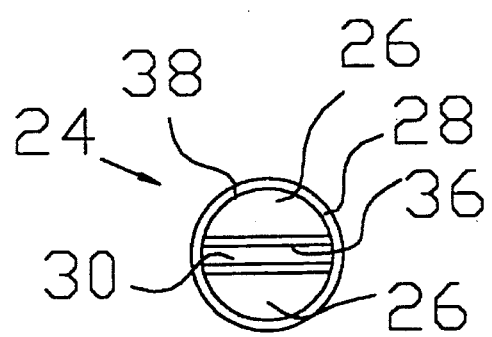
FIG. 3 is a top view of the prior art custom contact assembly depicted in FIG. 2.
Figure 4:
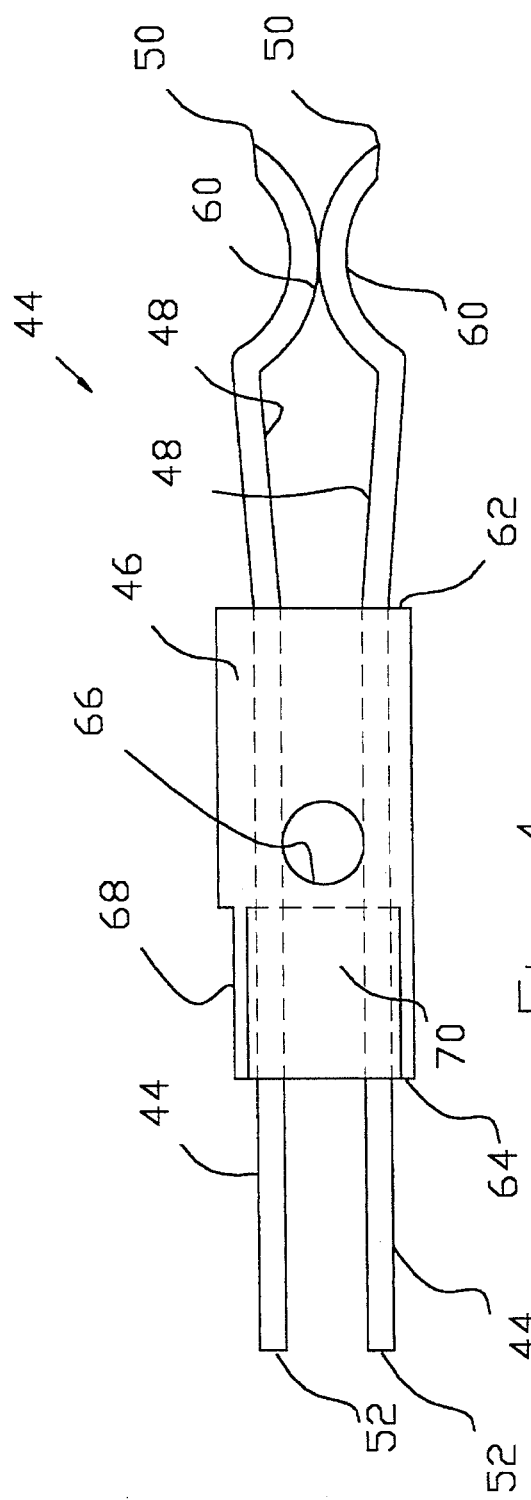
FIG. 4 is an enlarged side view of a tester contact embodiment.

Referring to the drawings, and particularly to FIG. 4, an embodiment of a tester contact 42 is depicted with two contact beams 44,44 mounted in a contact beam holder 46.

The two contact beams 44,44 provide a means for separate current sourcing and voltage sensing of a single electrical test point. However, other means for providing separate current sourcing and voltage sensing can be provided by, for example, a single probe having separate current sourcing and voltage sensing conductive paths. The separate current sourcing and voltage sensing capability will result in a very small voltage sense error as the level of current being sourced is increased. Furthermore, the two contact beams 44,44 provide a means for holding the test item when it is slid between the contacts. The holding of the test item will alleviate the need to continuously press the tester contact 42 against the test point during electrical testing.

Figure 5:
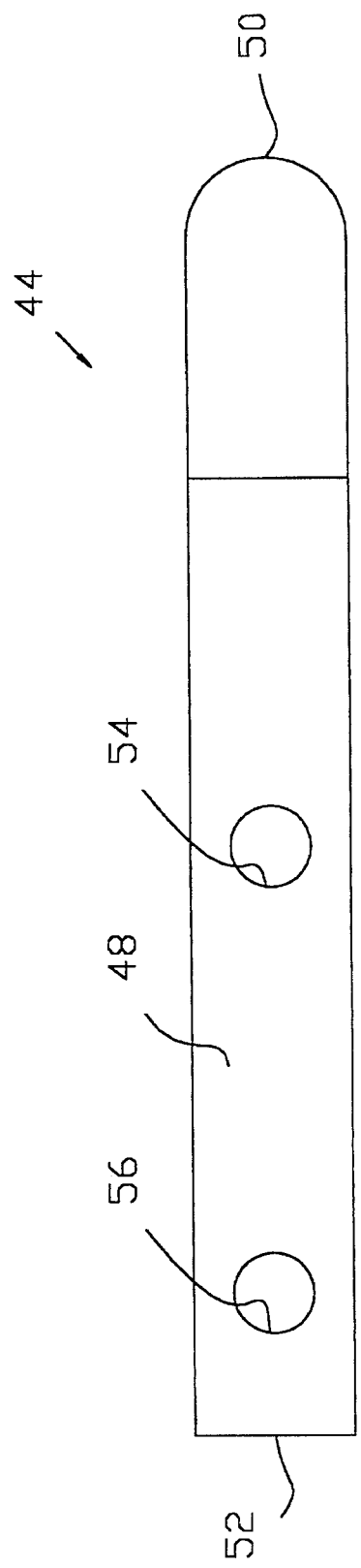
FIG. 5 is a plan view of one of the contact beams utilized by the tester contact of FIG. 4.

Referring to FIG. 5, a single contact beam 44 is depicted. In this preferred embodiment, the contact beam 44 is constructed of a resilient metallic material such as 190 Alloy, ½ HM tempered, heat treated, beryllium copper. The contact beam is heat treated at 575 degrees Fahrenheit for one hour and then tumbled to clean and deburr.

The contact beam 44 is generally rectangular in shape with a first side 48, a first end 50, and a second end 52. Means may be provided on the first end 50 of the contact beam 44 for facilitating a mechanical connection between the contact beam and the item to be tested. In the preferred embodiment shown in FIG. 4, the mechanical connection facilitating means consists of rounding the first end 50 of the contact beam. However, other means for facilitating the making of a mechanical connection can be utilized such as tapering the first end 50 of the contact beam 44.

The contact beam 44 also provides a means for securing its attachment to the contact beam holder (contact holder shown in FIG. 4). A variety of techniques can be used for securing the contact beam 44 to the contact holder. For example, the contact beam 44 can be provided with protrusions, bends, curves, dimples, and/or barbs. However, in the preferred embodiment depicted in FIG. 5, the securing means consists of a first mounting hole 54 which extends through the contact beam 44 and is positioned generally in the center of the beam.

Similarly, means for fastening the contact beam 44 to a wire conductor from the test equipment connector is provided. Once again, a multitude of techniques can be used for fastening the contact beam 44 to a wire conductor from the test equipment connector such as providing the contact beam 44 with protrusions, bends, curves, dimples, etc. In FIG. 5, the fastening means consists of a conductor mounting hole 56 which is provided adjacent to the second end 52 of the contact beam 44.

Turning to FIG. 6, a side view of the contact beam 44 is depicted. The contact beam 44 utilizes an electrical connection facilitating means for forming an electrical connection between the contact beam and the test item. In the preferred embodiment depicted in FIG. 6, the electrical connection facilitating means consists of a curvature 60 in the contact beam located adjacent to the first end 50. In addition, the curvature 60 also serves as a means for wiping foreign matter away from the electrical point to be tested. However, other electrical connection facilitating means and means for wiping foreign matter away can be used. For example, fitting the contact beam 44 with protrusions, dimples, etc.

Referring back to FIG. 4, the two contact beams 44,44 are partially mounted within the contact beam holder 46. The contact beam holder 46 is generally cylindrical in shape with a first end 62 and a second end 64. In this preferred embodiment, the contact beam holder 46 is made of a rigid insulative material such as Zytet 33% glass filled nylon. Accordingly, the insulative material of the contact beam holder 46 provides a means for quick and simple fixturing of the test contact to the test equipment connector which may have only a conductive mounting surface. Furthermore, the insulative contact beam holder 46 provides for the separation of each contact beam 44 so that separate current sourcing and voltage sensing can be performed.

The contact beam holder 46 also provides a means for attaching the tester contact 42 to the test equipment connector. The contact holder attaching means may consist of protrusions, tabs, indentations, or other techniques for promoting the attachment of the contact tester to the test equipment. In the preferred embodiment depicted in FIG. 4, the attaching means consists of a contact holder mounting hole 66 which extends through the contact beam holder 46 and between the contact beams 44,44.

Furthermore, the contact beam holder 46 also provides a means for ensuring the proper orientation of the tester contact 42 when attaching it to the test equipment connector.

Although the orientation means can consist of tabs, protrusion, or other alignments strategies, in FIG. 4 the outer perimeter of the contact holder, adjacent to the second end 64, is grooved to form a top wall 68 and two side walls 70 (only one side wall is depicted in FIG. 4).

Turning to the end view of the tester contact 42 depicted in FIG. 7, the top wall 68 extends parallel to the first side 48 of each of the contact beams 44,44 mounted in the contact holder 46.

Turning back to FIG. 4, it is shown that the first end 50 of each contact beam 44 extends from the first end 62 of the contact beam holder 46. Likewise, the second end 52 of each contact beam 44 extends from the second end 64 of the contact beam holder 46. The contact beams 44,44 are mounted so that they are generally parallel with each other with the first side 48 of each contact beam facing the first side of the other contact beam. In addition, the curvature 60 of each contact beam 44 abuts the curvature in the other contact beam. The contact beams 44,44 are positioned in such proximity to result in each contact beam 44 being angled away from the other contact beam in the area where the beams extend from the first end 62 of the contact beam holder 46. In a preferred embodiment, the contact beams 44,44 are angled one to five degrees away from each other.

Figure 8:
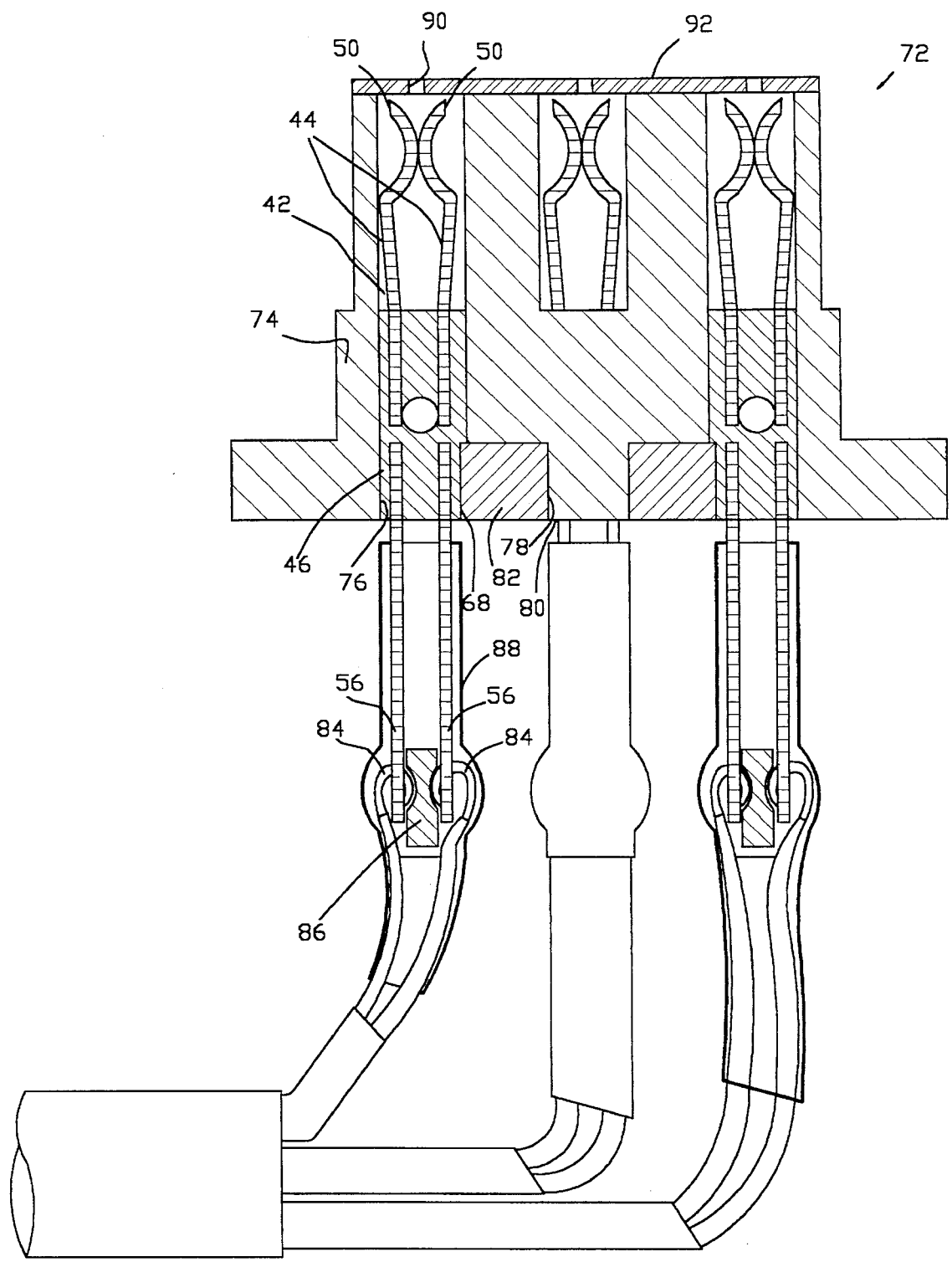
FIG. 8 is an enlarged cross-sectional view of a test equipment connector having three of the tester contacts of FIG. 4 inserted therein in a staggered configuration.

Turning to FIG. 8, an enlarged cross-sectional view of a test equipment connector 72 is depicted having three of the tester contacts of FIG. 4 inserted therein in a staggered configuration. The tester contact 42 is mounted to the test equipment connector housing 74 by inserting the first end 50 of the contact beams 44,44 into the test equipment's corresponding tester contact receiving socket 76. When the test contact 42 is fully inserted within the receiving socket 76, the tester contact 42 is oriented so that the top wall 68 of the contact beam holder 46 will face the channel 78 formed in the bottom 80 of the connector housing 74. Once the tester contact 42 is properly fitted within the connector housing 74, a key 82 is securely mounted within the channel 78 by using screws (screws not shown).

After being mounted to the connector housing 74, one connector wire 84,84 is threaded through the conductor mounting hole 56 and soldered to each of the contact beams of the tester contact 42. Next, an insulator 86 is positioned between the contact beams 44,44 on the second end so that they are electrically insulated from each other. Finally, the portion of the contact beams 44,44 from each tester contact 42 which extends from the bottom 80 of the connector housing 74 is securely wrapped with an insulator 88.

Once the tester contact 42 is mounted within the test equipment connector 72, the test item (not shown) is slid between the opening 90 provided in the top 92 of the connector housing 74 and in the area where the contact beams 44,44 abut. As the test item is slid between the contact beams 44,44, the contact beams will separate, scrape any foreign material from the test point, and hold onto the test item. After the test item is properly positioned between the contact beams 44,44, electrical testing and/or current sourcing of the test item can be provided by each of the contact beams. Thus, by utilizing both of the contact beams 44,44, separate current sourcing can be conducted by one beam while voltage sensing is conducted by the other beam.

When electrical testing has been completed, the test item is removed by sliding it from between the contact beams 44,44 of the tester contact 42. When the test item is removed from the tester contact 42, the contact beams will bend back into their initial position so that the curvature 60 in each contact beam will abut the curvature in the other contact beam. In addition, the tester contact 42 is prevented from leaving the connector housing 72 because the opening 90 in the top 92 of the housing is too small for the contact to escape.

Figure 9:
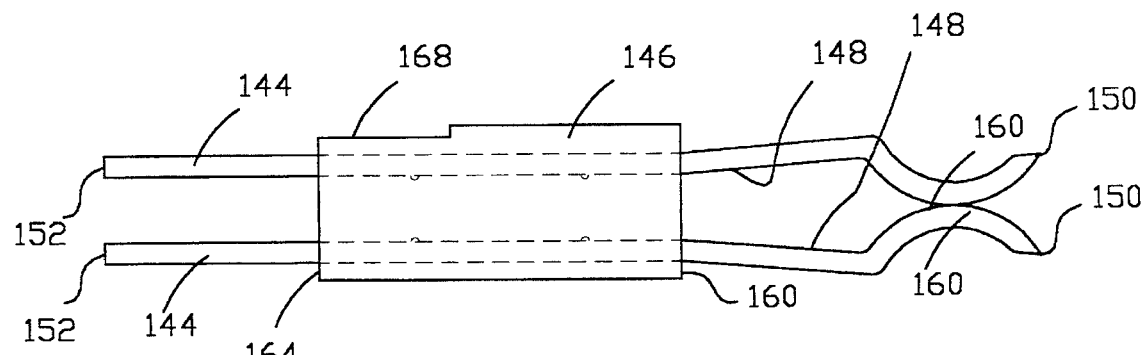
FIG. 9 is an enlarged side view of another tester contact embodiment.

Turning to FIG. 9, another preferred embodiment of the invention is depicted which differs in many respects from the embodiment shown in FIGS. 4–7 and thus allows for use with different test equipment connectors and/or test items. In FIG. 9, a tester contact 142 is again depicted with two contact beams 144, 144 mounted in a contact beam holder 146.

Referring to FIG. 9, a side view of a single contact beam 144 is shown. In this embodiment, the contact beam consists of a resilient metallic material consisting of 190 Alloy, XHM tempered, beryllium copper which is silver plated. The contact beam 144 is generally rectangular in shape with a first side 148, a first end 150 and a second end 152. In addition, the first end 150 of the contact beam 144 is tapered in order to facilitate the making of a mechanical connection between the contact beam and the test item to be tested.

Figure 10:
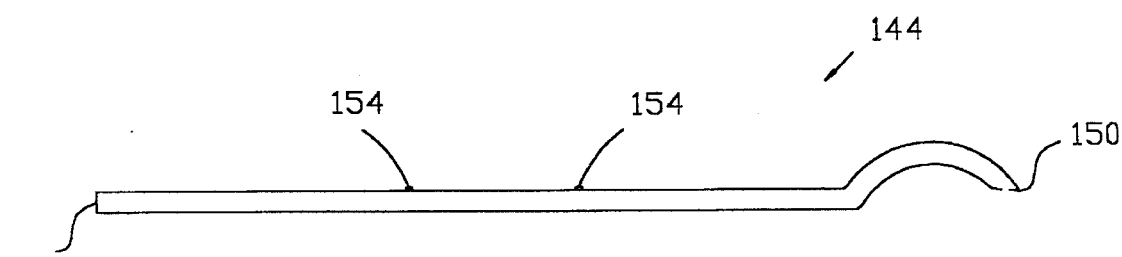
FIG. 10 is a side view of the contact beam shown in FIG. 9.

For securing the contact beam to the contact holder (contact holder shown in FIG. 9), the test contact 144 in FIG. 10 is provided with dimples 154,154.

Similarly, the contact beam 144 has an electrical connection facilitating means consisting of a curvature 160 in the contact beam which is located adjacent to the first end 150.

Referring back to FIG. 9, the two contact beams 144,144 are partially mounted within the contact beam holder 146. The contact beam holder 146 is generally cylindrical in shape with a first end 162 and a second end 164. In this preferred embodiment, the contact beam holder 146 is constructed of a rigid insulative material such as 6/6 nylon.

The contact beam holder 146 provides a means for providing proper orientation of the test contact 162 to the test equipment connector. The orientation means consists of a groove which forms a top wall 168 on the outer perimeter of the contact holder adjacent to the second end 164.

Figure 11:
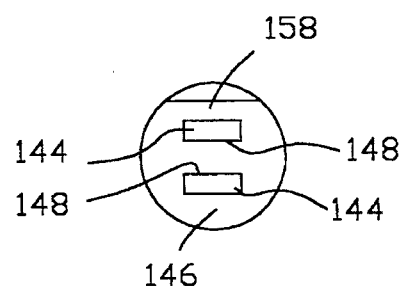
FIG. 11 is an end view of the tester contact shown in FIG. 9.

Turning to the end view of the tester contact 142 depicted in FIG. 11, the top wall 168 extends parallel to the first side 148 of each of the contact beams 144, 144 mounted in the contact holder 146.

Turning back to FIG. 9, the first end 150 of each contact beam 144 is shown to extend from the first end 162 of the contact beam holder 146. Likewise, the second end 152 of each contact beam 144 is shown to extend from the second end 164 of the contact beam holder 146. The contact beams 144, 144 are mounted so that they are generally parallel with each other with the first side 148 of each contact beam facing the first side of the other contact beam. In addition, the curvature 160 of each contact beam 144 abuts the curvature in the other contact beam. The contact beams 144,144 are positioned in such proximity to result in each contact beam being angled away from the other contact beam in the area where the beams extend from the first end 162 of the contact beam holder 146.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. A removable tester contact for providing a reliable test interface between an electrical test equipment connector, having a tester contact receiving socket, and a test item having an electrical test point, said tester contact comprising:
   a) a rigid contact holder formed of an insulating material for inserting into said tester contact receiving socket; and
   b) two contact beams mounted within said contact holder wherein each portion of the contact beams mounted within the contact holder is surrounded by the insulating material of the contact holder.

2. The tester contact of claim 1, wherein each contact beam having a first end, a second end, and being made of a resilient metal.

3. The tester contact of claim 2, further comprising means, located on at least one of said contact beams, for wiping foreign material away from said electrical test point.

4. The tester contact of claim 3, wherein said wiping means consists of a curvature located on at least one of said contact beams.

5. The tester contact of claim 1, wherein at least one of said contact beams is made of resilient metal for holding said test item.

6. The tester contact of claim 5, wherein said contact beams are mounted to said contact holder in parallel relation with each other.

7. The tester contact of claim 2, further comprising means for securing said contact beams to said contact holder.

8. The tester contact of claim 7, wherein said securing means consists of a first mounting hole positioned thorough said contact beams.

9. The tester contact of claim 7, wherein said securing means consists of a dimple mounted on said contact beams.

10. The tester contact of claim 2, further comprising a curvature located adjacent to said first end of at least one of said contact beams.

11. The tester contact of claim 1, further comprising means for ensuring proper orientation of said tester contact during installation of said tester contact within said test equipment.

12. The tester contact of claim 11, wherein said orientation means consists of a top wail and two side wails located on said contact holder.

13. The tester contact of claim 11, wherein said orientation means consists of a top wail located on said contact holder.

14. A removable tester contact for providing a reliable test interface between an electrical test equipment connector, having a tester contact receiving socket, and a test item, said tester contact comprising:
   a) a generally cylindrical contact holder for inserting into said tester contact receiving socket, said contact holder having
      i) a top wall and two side walls; and
      ii) a contact holder mounting hole extending through said contact beam holder; and
   b) two contact beams mounted generally parallel to each other within said contact holder, each contact beam being made of a resilient metal and having:
      i) a curved first end;
      ii) a first mounting hole;
      iii) a conductor mounting hole; and
      iv) a curvature located adjacent to the said first end.

15. A removable tester contact for providing a test interface between an electrical test equipment connector, having a tester contact receiving socket, and a test item, said tester contact comprising:
   a) a generally cylindrical contact holder for inserting within said tester contact receiving socket, said contact holder having a top wall; and
   b) two contact beams mounted generally parallel to each other within said contact holder, each contact beam being made of a resilient metal and having:
      i) a tapered first end;
      ii) a dimple; and
      iii) a curvature located adjacent to said first end.

16. A testing apparatus for testing electrical surfaces with a test equipment connector having a tester contact receiving socket, said testing apparatus comprising a tester contact having:
   a) means for orientating said tester contact to said testing apparatus, said orientating means comprising a contact beam holder for inserting within said tester contact receiving socket;
   b) means, associated with said orientating means, for eliminating voltage sense error of said tester contact, said voltage sense error eliminating means comprising a pair of contact beams electrically isolated from each other; and
   c) means, associated with said voltage sense error eliminating means, for removing foreign material from said electrical surface, said foreign material removing means comprising a bend located on at least one of said contact beams.

* * * * *